United States Patent
Aoyagi et al.

(10) Patent No.: US 10,723,920 B2
(45) Date of Patent: *Jul. 28, 2020

(54) CONDUCTIVE ADHESIVE

(71) Applicant: Tatsuta Electric Wire & Cable Co., Ltd., Higashiosaka-shi, Osaka (JP)

(72) Inventors: Yoshihiko Aoyagi, Kizugawa (JP); Osamu Isobe, Kizugawa (JP); Kenji Kamino, Kizugawa (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/484,718

(22) PCT Filed: Aug. 2, 2018

(86) PCT No.: PCT/JP2018/029109
§ 371 (c)(1),
(2) Date: Aug. 8, 2019

(87) PCT Pub. No.: WO2019/031393
PCT Pub. Date: Feb. 14, 2019

(65) Prior Publication Data
US 2020/0040231 A1  Feb. 6, 2020

(30) Foreign Application Priority Data
Aug. 7, 2017  (JP) ................. 2017-152479

(51) Int. Cl.
*H05K 1/18* (2006.01)
*C09J 9/02* (2006.01)
(Continued)

(52) U.S. Cl.
CPC ................. *C09J 9/02* (2013.01); *C09J 11/04* (2013.01); *C09J 175/06* (2013.01); *H01B 1/22* (2013.01);
(Continued)

(58) Field of Classification Search
USPC ........................................................ 361/760
See application file for complete search history.

(56) References Cited

U.S. PATENT DOCUMENTS

| 2008/0113184 | A1 | 5/2008 | Yoshida et al. |
| 2018/0134920 | A1 | 5/2018 | Takami et al. |
| 2020/0002582 | A1* | 1/2020 | Aoyagi ................. C09J 175/06 |

FOREIGN PATENT DOCUMENTS

| JP | 2005109160 A | 4/2005 |
| JP | 2007294918 A | 11/2007 |
(Continued)

OTHER PUBLICATIONS

International Search Report dated Oct. 16, 2018 for International Application No. PCT/JP2018/029109.

*Primary Examiner* — Andargie M Aychillhum
(74) *Attorney, Agent, or Firm* — Potomac Law Group, PLLC; Kenneth Fagin

(57) ABSTRACT

A conductive adhesive contains a thermosetting resin (A), a conductive filler (B), and a filling-performance improver (C). The thermosetting resin (A) contains a first resin component (A1) having a first functional group, and a second resin component (A2) having a second functional group that reacts with the first functional group. The filling-performance improver (C) contains an organic salt. The conductive adhesive contains from 40 to 140 parts by mass of the filling-performance improver (C) relative to 100 parts by mass of the thermosetting resin.

9 Claims, 7 Drawing Sheets

(51) Int. Cl.
    *C09J 11/04*         (2006.01)
    *C09J 175/06*      (2006.01)
    *H01B 1/22*         (2006.01)
    *H05K 1/02*         (2006.01)
    *H05K 9/00*         (2006.01)

(52) U.S. Cl.
    CPC ......... *H05K 1/0216* (2013.01); *H05K 1/0281* (2013.01); *H05K 1/18* (2013.01); *H05K 9/0083* (2013.01); *H05K 9/0088* (2013.01); *H05K 2201/0715* (2013.01); *H05K 2201/10371* (2013.01)

(56) References Cited

FOREIGN PATENT DOCUMENTS

| | | | |
|---|---|---|---|
| JP | 2007314742 | A | 12/2007 |
| JP | 2008144141 | A | 6/2008 |
| JP | 2008248151 | A | 10/2008 |
| JP | 2016204567 | A | 12/2016 |
| WO | 2014010524 | A1 | 1/2014 |
| WO | 2016190278 | A1 | 12/2016 |

\* cited by examiner

CONDUCTIVE ADHESIVE

TECHNICAL FIELD

The present disclosure relates to a conductive adhesive.

BACKGROUND ART

A conductive adhesive is often used for a flexible printed wiring board. For example, a flexible printed wiring board has been known to include an electromagnetic-wave shielding film bonded thereto and including a shielding layer and a conductive adhesive layer. In this case, the conductive adhesive needs to firmly bond an insulating film (a cover lay) provided on the surface of the flexible printed wiring board and the shielding layer together, and to ensure good conduction with a ground circuit exposed from an opening of the insulating film.

In recent years, as a result of reduced electrical device size, there has been a need to fill a small opening with a conductive adhesive to allow a ground circuit to be reliably conductive. For this reason, consideration has been made to improve the filling performance of the conductive adhesive (see, for example, Patent Document 1).

CITATION LIST

Patent Document

[Patent Document 1] International Publication No. 2014/010524

SUMMARY OF THE INVENTION

Technical Problem

However, a known conductive adhesive cannot be said to have sufficient filling performance. In addition, the conductive adhesive needs to have not only filling performance but also adhesiveness.

It is an object of the present disclosure to provide a conductive adhesive having improved filling performance and improved adhesiveness.

Solution to the Problem

A conductive adhesive according to one aspect includes a thermosetting resin (A); a conductive filler (B); and a filling-performance improver (C), wherein the thermosetting resin (A) contains a first resin component (A1) having a first functional group, and a second resin component (A2) having a second functional group that reacts with the first functional group, and the filling-performance improver (C) contains an organic salt, and the conductive adhesive contains from 40 to 140 parts by mass of the filling-performance improver (C) relative to 100 parts by mass of the thermosetting resin (A).

In one aspect of the conductive adhesive, the filling-performance improver (C) may be a metal salt of phosphinic acid.

In this case, the metal salt of phosphinic acid may have a median size of 5 µm or less.

In one aspect of the conductive adhesive, the first functional group may be an epoxy group, and the second resin component (A2) may have a glass transition temperature from 5° C. to 100° C., a number average molecular weight from 10,000 to 50,000, and a functional group that reacts with the epoxy group.

In one aspect of the conductive adhesive, the second resin component (A2) may be an urethane-modified polyester resin.

An electromagnetic-wave shielding film according to one aspect of the present disclosure includes a protective layer; and a conductive adhesive layer, wherein the conductive adhesive layer contains the conductive adhesive of the present disclosure.

A printed wiring board reinforcing plate according to one aspect of the present disclosure includes a conductive reinforcing plate; and a conductive adhesive layer provided on at least one of surfaces of the conductive reinforcing plate, wherein the conductive adhesive layer contains the conductive adhesive of the present disclosure.

A shield printed wiring board according to the present disclosure includes: a base member including a ground circuit; a cover lay covering the ground circuit, and having an opening through which a portion of the ground circuit is exposed; and an electromagnetic-wave shielding film bonded to the cover lay, wherein the electromagnetic-wave shielding film includes a conductive adhesive layer containing the conductive adhesive of the present disclosure.

A printed wiring board according to one aspect of the present disclosure includes: a base member including a ground circuit provided on at least one of surfaces of the base member; a cover lay covering the ground circuit, and having an opening through which a portion of the ground circuit is exposed; and a conductive reinforcing plate facing the ground circuit; an electronic component arranged on a portion of the base member corresponding to the conductive reinforcing plate, wherein the conductive adhesive layer contains the conductive adhesive of the present disclosure.

Advantages of the Invention

A conductive adhesive of the present disclosure can have improved filling performance and improved adhesiveness.

DETAILED DESCRIPTION

Figure 1:
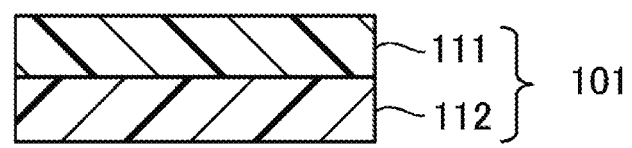
FIG. 1 is a cross-sectional view illustrating an example of an electromagnetic-wave shielding film.

A conductive adhesive of this embodiment contains a thermosetting resin (A), a conductive filler (B), and a filling-performance improver (C). The thermosetting resin (A) contains a first resin component (A1) having a first functional group, and a second resin component (A2) having a second functional group that reacts with the first functional group. The filling-performance improver (C) contains an organic salt. The conductive adhesive contains from 40 to 140 parts by mass of the filling-performance improver (C) relative to 100 parts by mass of the thermosetting resin.

—Thermosetting Resin (A)—

The first resin component (A1) of the thermosetting resin (A) includes molecules each having two or more first functional groups. The first functional groups may be any functional group that reacts with the second functional group included in the second resin component (A2), but may be, for example, an epoxy group, an amide group, a hydroxyl group, or any other functional group. In particular, an epoxy group is recommended.

If the first functional group is an epoxy group, examples of the first resin component (A1) include a bisphenol epoxy resin (such as a bisphenol A epoxy resin, a bisphenol F epoxy resin, or a bisphenol S epoxy resin), a glycidyl ether epoxy resin (such as a spirocyclic epoxy resin, a naphthalene epoxy resin, a biphenyl epoxy resin, a terpene epoxy resin, a tris(glycidyloxyphenyl)methane, or a tetrakis(glycidyloxyphenyl)ethane), a glycidyl amine epoxy resin (such as a tetraglycidyl diamino diphenylmetane), a tetrabrombisphenol A epoxy resin, a novolac epoxy resin (such as a cresol novolac epoxy resin, a phenol novolac epoxy resin, an α-naphthol novolac epoxy resin, or a brominated phenol novolac epoxy resin), and a rubber-modified epoxy resin. One kind of these substances may be used alone, or two or more kinds thereof may be used in combination. These epoxy resins may be solid or liquid at room temperature. A situation where the epoxy resins are "solid at room temperature" means a situation where the epoxy resins do not have flowability at a temperature of 25° C. without a solvent. A situation where the epoxy resins are "liquid at room temperature" means a situation where the epoxy resins have flowability under the same conditions.

The number average molecular weight of the first resin component (A1) is not specifically limited. However, to increase the bulk strength of the adhesive, it is preferably 500 or more and more preferably 1,000 or more. In addition, to increase adhesiveness, the number average molecular weight is preferably 10,000 or less and more preferably 5,000 or less.

The second resin component (A2) has a second functional group that reacts with the first functional group of the first resin component (A1). If the first functional group is an epoxy group, the second functional group may be a hydroxyl group, a carboxyl group, an epoxy group, an amino group, or any other functional group. In particular, a hydroxyl group and a carboxyl group are recommended. If the first functional group is an amide group, the second functional group may be a hydroxyl group, a carboxyl group, an amino group, or any other functional group. If the first functional group is a hydroxyl group, the second functional group may be an epoxy group, a carboxyl group, an amide group, or any other functional group.

If the second functional group is a carboxyl group, the second resin component (A2) may be, for example, an urethane-modified polyester resin. The urethane-modified polyester resin is a polyester resin containing an urethane resin as a copolymer component. The urethane-modified polyester resin can be obtained through a reaction between an isocyanate component and a terminal hydroxyl group of a polyester resin that has been obtained through condensation polymerization of an acid component, such as a polyvalent carboxylic acid or an anhydride thereof, and a glycol component. In addition, an urethane-modified polyester resin can be obtained through a simultaneous reaction among an acid component, a glycol component, and an isocyanate component.

Non-limiting examples of the acid component include terephthalic acid, isophthalic acid, orthophthalic acid, 1,5-naphthalenedicarboxylic acid, 2,6-naphthalenedicarboxylic acid, 4,4'-diphenyldicarboxylic acid, 2,2'-diphenyldicarboxylic acid, 4,4'-diphenyletherdicarboxylic acid, adipic acid, azelaic acid, sebacic acid, 1,4-cyclohexanedicarboxylic acid, 1,3-cyclohexanedicarboxylic acid, 1,2-cyclohexanedicarboxylic acid, 4-methyl-1,2-cyclohexanedicarboxylic acid, dimer acid, dehydrated trimellitic acid, dehydrated pyromellitic acid, and 5-(2,5-dioxotetrahydro-3-furanyl)-3-methyl-3-cyclohexene-1,2-dicarboxylic anhydride.

Non-limiting examples of the glycol component include dihydric alcohols (such as ethylene glycol, propylene glycol, 1,3-propanediol, 2-methyl-1,3-propanediol, 1,2-butanediol, 1,3-butanediol, 1,4-butanediol, 1,5-pentanediol, 1,6-hexanediol, 3-methyl-1,5-pentanediol, neopentylglycol, diethylene glycol, dipropylene glycol, 2,2,4-trimethyl-1,5-pentanediol, cyclohexane dimethanol, neopentyl hydroxypivalate, an ethylene oxide adduct and a propylene oxide adduct of bisphenol A, 1,9-nonanediol, 2-methyl octanediol, 1,10-decanediol, 2-butyl-2-ethyl-1,3-propanediol, tricyclodecane dimethanol, polyethylene glycol, polypropylene glycol, and polytetramethylene glycol), and, if necessary, tri- or more valent polyvalent alcohols (such as trimethyl propane, trimethylol ethane, and pentaerythritol).

Non-limiting examples of the isocyanate component include 2,4-tolylene diisocyanate, 2,6-tolylene diisocyanate, p-phenylene isocyanate, diphenyl methane diisocyanate, m-phenylene diisocyanate, hexamethylene diisocyanate, tetramethylene diisocyanate, 3,3'-dimethoxy-4,4'-biphenylene diisocyanate, 1,5-naphthalene diisocyanate, 2,6-naphthalene diisocyanate, 3,3'-dimethoxy-4,4'-diisocyanate, 4,4'-diphenylene diisocyanate, 1,5-xylylene diisocyanate, 1,3-methylcyclohexane diisocyanate, 1,4-methylcyclohexane diisocyanate, and isophorone diisocyanate.

The second resin component (A2) is not limited to an urethane-modified polyester resin. Examples of the second resin component (A2) include an acid anhydride-modified polyester resin and an epoxy resin.

If an urethane-modified polyester resin is used as the second resin component (A2), the second resin component (A2) has a glass transition temperature of preferably 5° C. or higher, more preferably 10° C. or higher, and still more preferably 30° C. or higher to further improve the filling performance. The glass transition temperature is preferably 100° C. or lower, more preferably 90° C. or lower, and still more preferably 80° C. or lower. Note that the glass transition temperature can be measured with a differential scanning calorimeter (DSC).

If an urethane-modified polyester resin is used as the second resin component (A2), the second resin component (A2) has a number average molecular weight (Mn) of preferably 10,000 or more and 50,000 or less and more preferably 30,000 or less to further improve the filling performance. Note that Mn can be a value measured by gel permeation chromatography (GPC) and calculated in terms of styrene.

If an urethane-modified polyester resin having a carboxyl group is used as the second resin component (A2), the second resin component (A2) has an acid value of preferably 5 mgKOH/g or more, more preferably 10 mgKOH/g or more, and still more preferably 15 mgKOH/g or more, to increase heat resistance. The acid value is preferably 50 mgKOH/g or less, more preferably 45 mgKOH/g or less, and still more preferably 40 mgKOH/g or less. Note that the acid value can be measured in accordance with JIS K0070: 1992.

If the first resin component (A1) is an epoxy resin, and the second resin component (A2) is an urethane-modified polyester resin, the ratio (A1/(A1+A2)) of the mass of the first resin component (A1) to the total mass of the first resin component (A1) and the second resin component (A2) may be 1% by mass or more, preferably 3% by mass or more, and 15% by mass or less, preferably 10% by mass or less. Setting the mass ratio of the first resin component (A1) and the second resin component (A2) to such a range can improve adhesiveness.

The thermosetting resin (A) can contain a curing agent (A3) that accelerates a reaction between the first functional group of the first resin component (A1) and the second functional group of the second resin component (A2). The curing agent (A3) can be appropriately selected in accordance with the kinds of the first and second functional groups. If the first functional group is an epoxy group, and the second functional group is a hydroxyl group, examples of the curing agent include an imidazole curing agent, a phenolic curing agent, and a cationic curing agent. One kind of these substances may be used alone, or two or more kinds thereof may be used in combination.

Examples of the imidazole curing agent include compounds in which an alkyl group, an ethylcyano group, a hydroxyl group, an azine, etc., are added to the imidazole ring, such as 2-phenyl-4,5-dihydroxymethyl imidazole, 2-heptadecylimidazole, 2,4-diamino-6-(2'-undecyl imidazolyl)ethyl-S-triazine, 1-cyanoethyl-2-phenylimidazole, 2-phenylimidazole, 5-cyano-2-phenylimidazole, 2,4-diamino-6-[2'methylimidazolyl-(1')]-ethyl-S-triazine isocyanuric acid adduct, 2-phenyl imidazole isocyanuric acid adduct, 2-methyl imidazole isocyanuric acid adduct, and 1-cyanoethyl-2-phenyl-4,5-di(2-cyanoethoxy)methylimidazole.

Examples of the phenolic curing agent include novolac phenol and a naphtholic compound.

Examples of the cationic curing agent include an amine salt of boron trifluoride, an antimony pentachloride-acetyl chloride complex, a sulfonium salt having a phenethyl group or an allyl group.

The curing agent (A3) does not have to be blended. However, to accelerate the reaction, the content of the curing agent (A3) with respect to 100 parts by mass of the first resin component (A1) is preferably 0.3 or more parts by mass and more preferably 1 or more parts by mass, and is preferably 20 or less parts by mass and more preferably 15 or less parts by mass.

—Conductive Filler (B)—

Non-limiting examples of the conductive filler (B) include a metal filler, a metal-sheathed resin filler, a carbon filler, and a mixture of these fillers. Examples of the metal filler include a copper powder, a silver powder, a nickel powder, a silver-coated copper powder, a gold-coated copper powder, a silver-coated nickel powder, and a gold-coated nickel powder. These metal powders can be obtained through electrolysis, atomization, reduction, or any other process. In particular, any one of the silver powder, the silver-coated copper powder, and the copper powder is recommended.

To improve contact between filler powders, the average particle size of the conductive filler (B) is, but not limited to, preferably 1 μm or more and more preferably 3 μm or more, and preferably 50 μm or less and more preferably 40 μm or less. The shape of the conductive filler (B) may be, but not limited to, a spherical shape, a flaky shape, a dendritic shape, a fibrous shape, or any other shape. However, to obtain a good interconnect resistance, the shape is preferably dendritic.

The content of the conductive filler (B) relative to the total solid content can be appropriately selected depending on the intended use, but is preferably 5% by mass or more and more preferably 10% by mass or more, and is preferably 95% by mass or less and more preferably 90% by mass or less. To improve the filling performance, the content is preferably 70% by mass or less and more preferably 60% by mass or less. If anisotropic conductivity is to be achieved, the content is preferably 40% by mass or less and more preferably 35% by mass or less.

—Filling-Performance Improver (C)—

The filling-performance improver (C) is a component that maintains the loss modulus of the conductive adhesive within a certain range even at a high temperature to improve the filling performance. The filling-performance improver (C) may be an organic salt. Among organic salts, phosphates such as polyphosphates and metal salts of phosphinic acid are recommended, and metal salts of phosphinic acid are further recommended. Examples of the metal salts of phosphinic acid include an aluminum salt, a sodium salt, a potassium salt, a magnesium salt, and a calcium salt. In particular, an aluminum salt is recommended. Examples of the polyphosphates include a melamine salt, a methylamine salt, an ethylamine salt, a diethylamine salt, a triethylamine salt, an ethylenediamine salt, a piperazine salt, a pyridine salt, a triazine salt, and an ammonium salt. In particular, a melamine salt is recommended. Examples of the organic salts other than phosphates include melamine cyanurate, melamine pyrophosphate, and melam methanesulfonate. In particular, melamine cyanurate is recommended.

To improve the filling performance, the content of the filling-performance improver (C) with respect to 100 parts by mass of the thermosetting resin (A) is preferably 40 or more parts by mass and more preferably 50 or more parts by mass, and is preferably 140 or less parts by mass, more preferably 120 or less parts by mass, still more preferably 100 or less parts by mass, and yet more preferably 80 or less parts by mass.

Preferably, the filling-performance improver (C) does not project from the film of the conductive adhesive, and has a particle size that is smaller than the thickness of the film of the conductive adhesive. Depending on the thickness of the film to be finally formed, the median size of the filling-performance improver (C) may be preferably 5 μm or less and more preferably 4 μm or less. For easy handling, the median size may be preferably 1 μm or more and more preferably 2 μm or more.

Note that the median size is a particle size at which the cumulative frequency from the smallest particle size is 50% on a particle-size distribution curve obtained with a laser diffraction particle size distribution analyzer (where the ordinate represents the cumulative frequency (%), and the abscissa represents the particle size).

—Optional Components—

The conductive adhesive according to this embodiment can contain, as optional components, an anti-foam agent, an antioxidant, a viscosity modifier, a diluent, an anti-settling agent, a leveling agent, a coupling agent, a coloring agent, a fire retardant, and any other agent.

First Embodiment (Electromagnetic-Wave Shielding Film)

Figure 2:
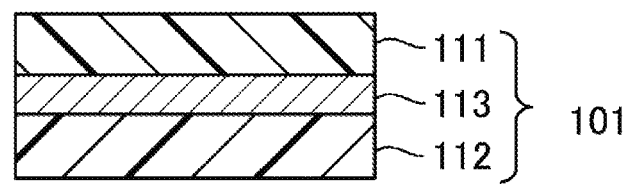
FIG. 2 is a cross-sectional view illustrating a variation of an electromagnetic-wave shielding film.

The conductive adhesive of the present disclosure can be used for an electromagnetic-wave shielding film 101 including a protective layer 112 and a conductive adhesive layer 111 as shown in FIG. 1. Such an electromagnetic-wave shielding film allows the conductive adhesive layer 111 to function as a shield. As shown in FIG. 2, a shielding layer 113 may be separately provided between the protective layer 112 and the conductive adhesive layer 111.

—Protective Layer—

The protective layer 112 may be any layer that has sufficient insulating performance and protects the conductive adhesive layer 111 and, if necessary, the shielding layer 113. Examples of the protective layer 112 include a thermoplastic resin composition, a thermosetting resin composition, and an active energy ray-curable composition.

Non-limiting examples of the thermoplastic resin composition include a styrene resin composition, a vinyl acetate resin composition, a polyester resin composition, a polyethylene resin composition, a polypropylene resin composition, an imide resin composition, and an acrylic resin composition. Non-limiting examples of the thermosetting resin composition include a phenolic resin composition, an epoxy resin composition, an urethane resin composition, a melamine resin composition, and an alkyd resin composition. Non-limiting examples of the active energy ray-curable composition include a polymerizable compound including molecules each having at least two (meth)acryloyloxy groups. The protective layer may be made of a single material, or may be made of two or more materials.

The protective layer 112 may be a stack of two or more layers made of different materials or having different physical properties such as the hardness or the elasticity modulus. For example, if a stack of an outer layer having a low hardness and an inner layer having a high hardness is used, the outer layer functions as a cushion. This can reduce the pressure applied to the shielding layer 113 in the step of bonding the electromagnetic-wave shielding film 101 to the printed wiring board under heating and pressure. This can prevent the shielding layer 113 from being broken due to a step formed on the printed wiring board.

The protective layer 112 may contain, as necessary, at least one of a curing promoter, a tackifier, an antioxidant, a pigment, a colorant, a plasticizer, an ultraviolet absorber, an anti-foam agent, a leveling agent, a filler, a fire retardant, a viscosity modifier, an antiblocking agent, and other agents.

The thickness of the protective layer 112 is not specifically limited, and can be appropriately determined as necessary. The thickness of the protective layer 112 may be preferably 1 μm or more and more preferably 4 μm or more, and may be preferably 20 μm or less, more preferably 10 μm or less, and still more preferably 5 μm or less. Setting the thickness of the protective layer 112 to be 1 μm or more allows the conductive adhesive layer 111 and the shielding layer 113 to be adequately protected. Setting the thickness of the protective layer 112 to be 20 μm or less allows the electromagnetic-wave shielding film 101 to be sufficiently flexible, and facilitates using the electromagnetic-wave shielding film 101 for a member that needs to be flexible.

—Shielding Layer—

If the electromagnetic-wave shielding film 101 includes the shielding layer 113, the shielding layer 113 may be configured as a metal layer, a conductive filler, or any other layer. If the shielding layer 113 is a metal layer, the metal layer may be made of any one of nickel, copper, silver, tin, gold, palladium, aluminum, chromium, titanium, zinc, and any other metal, or an alloy containing two or more of these metals. The metal layer can be produced by using metal foil or by depositing a metal film through an additive process. Examples of the additive process include electrolytic plating, electroless plating, sputtering, electron-beam evaporation, vacuum evaporation, chemical vapor deposition (CVD), and metal-organic chemical vapor deposition (MOCVD).

If the shielding layer 113 is configured as the conductive filler, metal nanoparticles or a conductive filler may be used. Examples of the metal nanoparticles include silver nanoparticles, gold nanoparticles, and other nanoparticles. Examples of the conductive filler include a metal filler, a metal-sheathed resin filler, a carbon filler, and a mixture of these fillers. Examples of the metal fillers include a copper powder, a silver powder, a nickel powder, a silver-coated copper power, a gold-coated copper powder, a silver-coated nickel powder, and a gold-coated nickel powder. These metal powders can be obtained through electrolysis, atomization, and reduction. Examples of the shape of the metal powders include a spherical shape, a flaky shape, a fibrous shape, and a dendritic shape.

The metal material and thickness of the shielding layer 113 merely needs to be appropriately selected according to the required electromagnetic-wave shielding effect and tolerance to repeated flexing and sliding. The thickness may be about 0.1 μm to 12 μm.

If the electromagnetic-wave shielding film 101 includes the shielding layer 113, the content of the conductive filler (B) in the conductive adhesive to be the conductive adhesive layer 111 is preferably 3% by mass or more and more preferably 5% by mass or more, to improve the shielding performance. To reduce cost, the upper limit of the content is preferably 40% by mass or less and more preferably 35% by mass or less.

If the electromagnetic-wave shielding film 101 does not include the shielding layer 113, and the conductive adhesive layer 111 functions as a shield, the content of the conductive filler (B) in the conductive adhesive is preferably set to be 40% by mass or more, to provide sufficient shielding performance. To increase tolerance of the electromagnetic-wave shielding film 101 to flexing, the upper limit of the content of the conductive filler (b) is preferably 90% by mass or less.

(Method for Forming Electromagnetic-Wave Shielding Film)

An example of a method for forming an electromagnetic-wave shielding film 101 will now be described. However, this method is merely an example of the present disclosure.

—Formation of Protective Layer—

Figure 3A:
FIGS. 3A to 3C are cross-sectional views sequentially illustrating a method for forming an electromagnetic-wave shielding film.

First, as shown in FIG. 3A, a protective layer composition is applied onto a support substrate 151 to form a protective layer 112. The protective layer composition can be prepared through addition of suitable amounts of a solvent and other compounding ingredients to a resin composition. Examples of the solvent include toluene, acetone, methyl ethyl ketone, methanol, ethanol, propanol, and dimethyl formamide Examples of the other compounding ingredients that can be added include a crosslinker, a polymerization catalyst, a curing promoter, and a coloring agent. The other compounding ingredients may be added if necessary, and do not have to be added. The process of applying the protective layer composition to the support substrate 151 is not specifically limited. Examples of the process include known techniques such as lip coating, comma coating, gravure coating, and slot-die coating.

The support substrate 151 may be, for example, in the form of a film. The support substrate 151 is not specifically limited. Examples of the material of the support substrate 151 include a polyolefinic material, a polyester material, a polyimide material, and a polyphenylene sulfide material. A release agent layer may be provided between the support substrate 151 and the protective layer composition.

The protective layer composition that has been applied onto the support substrate 151 is heated and dried to remove the solvent, thereby forming the protective layer 112. The support substrate 151 can be separated from the protective layer 112. The support substrate 151 can be separated after the electromagnetic-wave shielding film 101 is bonded to the printed wiring board. This allows the support substrate 151 to protect the electromagnetic-wave shielding film 101.

—Formation of Shielding Layer—

Figure 3B:
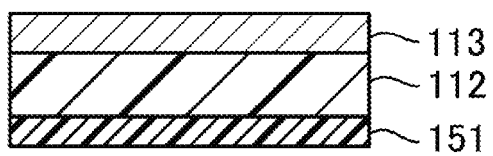

Next, as shown in FIG. 3B, a shielding layer 113 is formed on the surface of the protective layer 112. If the shielding layer 113 is a metal film, the shielding layer 113 can be formed through electrolytic plating, electroless plating, sputtering, electron-beam evaporation, vacuum evaporation, CVD, MOCVD, or any other process. If the shielding layer 113 is made of a conductive filler, a solvent containing the conductive filler can be applied onto the surface of the protective layer and then dried to form the shielding layer 113. If the electromagnetic-wave shielding film 101 includes no shielding layer 113, this process step can be omitted.

—Formation of Conductive Adhesive Layer—

Figure 3C:
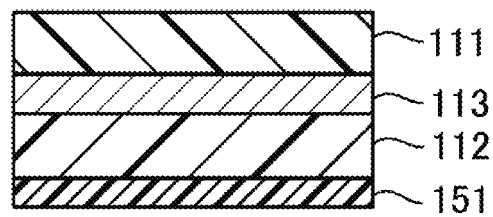

Next, as shown in FIG. 3C, a conductive adhesive layer composition is applied onto the shielding layer 113, and then dried by heating to remove the solvent, thereby forming a conductive adhesive layer 111.

The conductive adhesive layer composition contains a conductive adhesive and a solvent. Examples of the solvent include toluene, acetone, methyl ethyl ketone, methanol, ethanol, propanol, and dimethyl formamide. The proportion of the conductive adhesive in the conductive adhesive layer composition merely needs to be appropriately set in accordance with the thickness of the conductive adhesive layer 111 and other factors.

The process of applying the conductive adhesive layer composition onto the shielding layer 113 is not specifically limited. Examples of the process include lip coating, comma coating, gravure coating, and slot-die coating.

The conductive adhesive layer 111 preferably has a thickness of 1 μm to 50 μm. Setting the thickness to be 1 μm or more allows the conductive adhesive layer to have sufficient filling performance and to be adequately connected to a ground circuit. Further, setting the thickness to be 50 μm or less can satisfy the need to reduce the layer thickness, and helps reduce cost.

If necessary, a release substrate (a separate film) may be bonded to the surface of the conductive adhesive layer 111. It is possible to use, as the release substrate, a base film, made of polyethylene terephthalate, polyethylene naphthalate, or other materials, to which a silicone or non-silicone release agent is applied on a surface where the conductive adhesive layer 111 is formed. The thickness of the release substrate is not specifically limited, and can be appropriately determined in view of ease of use.

(Shield Printed Wiring Board)

Figure 4:
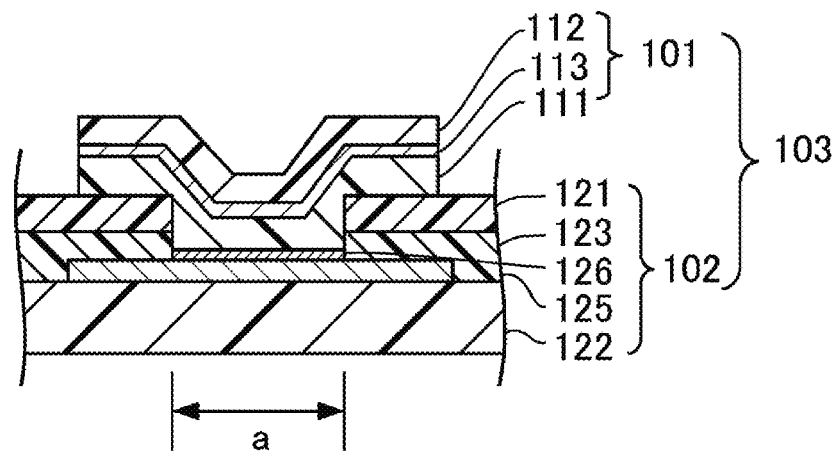
FIG. 4 is a cross-sectional view illustrating a shield printed wiring board.

The electromagnetic-wave shielding film 101 according to this embodiment can be used for a shield printed wiring board 103 shown in FIG. 4. As shown in FIG. 4, the shield printed wiring board 103 includes a printed wiring board 102 and an electromagnetic-wave shielding film 101.

The printed circuit board 102 includes, for example, a base member 122 and a printed circuit including a ground circuit 125 provided on the base member 122. An insulating film 121 is bonded onto the base member 122 through an adhesive layer 123. The insulating film 121 has an opening 128 through which the ground circuit 125 is exposed. A surface layer 126 that is a gold plated layer is provided on an exposed portion of the ground circuit 125. Note that the printed wiring board 102 may be a flexible substrate or a rigid substrate.

Figure 5:
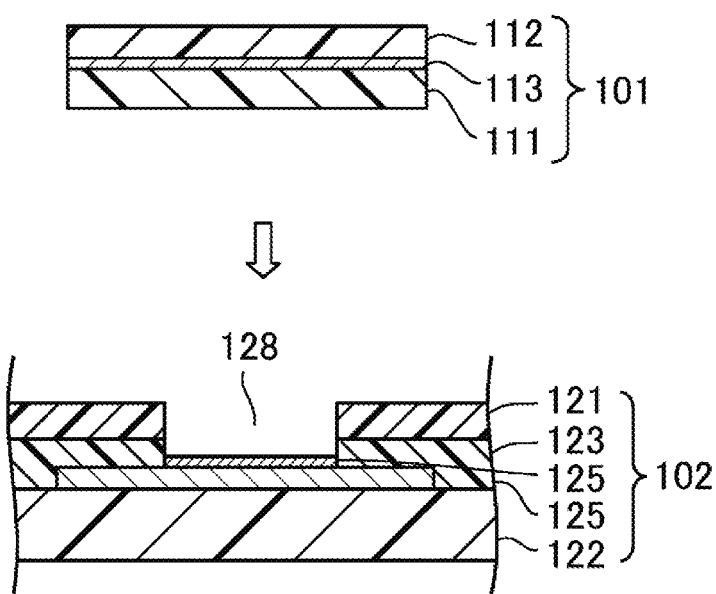
FIG. 5 is a cross-sectional view illustrating a process for forming a shield printed wiring board.

Now, a method for forming the shield printed wiring board 103 will be described. First, as shown in FIG. 5, a printed wiring board 102 and an electromagnetic-wave shielding film 101 are prepared.

Next, the electromagnetic-wave shielding film 101 is arranged on, and temporarily fixed to, the printed wiring board 102 so that the conductive adhesive layer 111 is located over the opening 128.

Subsequently, the temperatures of two hot plates are set at a predetermined temperature (for example, 170° C.) higher than those during the temporary fixing process. A predetermined pressure (for example, 3 MPa) is applied to the electromagnetic-wave shielding film 101 for a predetermined time (for example, 30 minutes) using these hot plates. As a result, the electromagnetic-wave shielding film 101 can be fixed on the printed wiring board 102.

In this case, part of the conductive adhesive layer 111 which has been softened by the heat flows into the opening 128 due to the pressure applied. As a result, the shielding layer 113 and the ground circuit 125 are connected together. The part of the conductive adhesive layer 111 that is large enough to fill the opening 128 is present between the shielding layer 113 and the printed wiring board 102. Thus, the electromagnetic-wave shielding film 101 and the printed wiring board 102 are bonded together with sufficient strength. The conductive adhesive layer 111, which has high filling performance, can have high connection stability even when exposed to high temperatures during reflowing in a component mounting process.

Thereafter, a solder reflow process for component mounting is performed. In the reflow process, the electromagnetic-wave shielding film 101 and the printed wiring board 102 are exposed to a high temperature of about 260° C. Non-limiting examples of components to be mounted include, in addition to a connector and an integrated circuit, a chip component such as a resistor and a capacitor.

The conductive adhesive of this embodiment, which has high filling performance, sufficiently fills the opening 128 even if the diameter of the opening 128 is small, such as 1 mm or less. This can ensure good connection between the electromagnetic-wave shielding film 101 and the ground circuit 125. If the conductive adhesive insufficiently fills the opening, fine bubbles enter the gap between a combination of the surface layer 126 and the insulating film 121 and the conductive adhesive layer 111. As a result, when the conductive adhesive layer 111 is exposed to high temperatures in the reflow process, the bubbles may grow, and the interconnect resistance of the conductive adhesive layer 111 may increase. This may cause the conductive adhesive layer 111 to be separated at worst. However, the conductive adhesive layer 111 of this embodiment has good adhesiveness with the surface layer 126 and the insulating film 121, and keeps having good adhesiveness even after the reflow process. Thus, low interconnect resistance can be maintained.

It is recommended that the interconnect resistance after the reflow process as an index of filling performance be as low as possible. However, the interconnect resistance to an opening with a diameter of 0.5 mm to be described in examples, for example, can be set to be preferably 300 mΩ/hole or less, more preferably 250 mΩ/hole or less, and still more preferably 200 mΩ/hole or less.

To allow the conductive adhesive to have high filling performance, the conductive adhesive preferably maintains its loss modulus within a somewhat high loss modulus range in a range of temperatures from the highest one of temperatures to which the conductive adhesive is exposed when bonded to the printed wiring board to the reflow temperature. The highest temperature to which the conductive adhesive is exposed when bonded may be about 130° C. to 190° C., and the reflow temperature may be about 240° C. to 260° C. For this reason, the loss modulus at 140° C. may be preferably $5.0 \times 10^4$ Pa or more and more preferably $7.0 \times 10^4$ Pa or more, and may be preferably $3.0 \times 10^5$ Pa or less and more preferably $2.5 \times 10^5$ Pa or less. The loss modulus at 170° C. may be preferably $5.0 \times 10^4$ Pa or more and more preferably $7.0 \times 10^4$ Pa or more, and may be preferably $4.0 \times 10^5$ Pa or less and more preferably $3.5 \times 10^5$ Pa or less. Further, the loss modulus at 200° C. may be preferably $5.0 \times 10^4$ Pa or more and more preferably $7.0 \times 10^5$ Pa or more, and may be preferably $4.0 \times 10^5$ Pa or less and more preferably $3.5 \times 10^5$ Pa or less.

To allow the conductive adhesive to have high filling performance, the storage modulus is preferably maintained at a somewhat low value in such a temperature range. Specifically, the storage modulus at 190° C. may be preferably $1.0 \times 10^5$ Pa or more and $2.0 \times 10^5$ Pa or less. The storage modulus at 170° C. may be preferably $1.0 \times 10^4$ Pa or more and $2.5 \times 10^5$ Pa or less. The storage modulus at 120° C. may be preferably $1 \times 10^5$ Pa or more and $4.0 \times 10^5$ Pa or less. The storage modulus at 70° C. may be preferably $1.0 \times 10^5$ Pa or more and $1 \times 10^6$ Pa or less. Setting the storage modulus within the above range makes it difficult to accumulate latent stress in the conductive adhesive during hot pressing. As a result, the filling performance is improved.

Furthermore, preferably, the storage modulus curve of the conductive adhesive of the present disclosure from 40° C. to 120° C. does not show a distinct maximum value greater than the storage modulus at 40° C. A situation where the storage modulus curve does not show a maximum value in this temperature range makes it difficult to accumulate latent stress in the conductive adhesive during hot pressing. As a result, the filling performance is improved.

To firmly bond the electromagnetic-wave shielding film 101, the peel strength between the conductive adhesive layer 111 and the surface layer 126 is preferably higher, and more specifically, is preferably 3.0 N or more per 10 mm, more preferably 3.5 N or more per 10 mm, and still more preferably 4.0 N or more per 10 mm. The peel strength between the conductive adhesive layer 111 and the insulating film 121 is preferably higher, and more specifically, is preferably 3.0 N or more per 10 mm, more preferably 5.0 N or more per 10 mm, and still more preferably 7.0 N or more per 10 mm.

The base member 122 may be, for example, a resin film or any other film, specifically, a film made of a resin such as polypropylene, cross-linked polyethylene, polyester, polybenzimidazole, polyimide, polyimideamide, polyetherimide, polyphenylene sulfide, or any other resin.

Non-limiting examples of the material of the insulating film 121 include resins such as polyethylene terephthalate, polypropylene, cross-linked polyethylene, polyester, polybenzimidazole, polyimide, polyimideamide, polyetherimide, and polyphenylene sulfide. The thickness of the insulating film 121 is not specifically limited, but may be about 10 μm to 30 μm.

The printed circuit including the ground circuit 125 may be, for example, a copper wiring pattern formed on the base member 122. The surface layer 126 is not limited to a gold plated layer, and may be a layer made of copper, nickel, silver, tin, or any other metal. Note that the surface layer 126 may be provided if necessary, and may be prevented from being provided.

The conductive adhesive of this embodiment has good filling performance and good adhesiveness, and is particularly effective at bonding the electromagnetic-wave shielding film 101 to the printed wiring board 102. However, this conductive adhesive is also useful in other applications in which the conductive adhesive is used. For example, this conductive adhesive can be used for an adhesive layer included in a conductive reinforcing plate.

Second Embodiment (Conductive Reinforcing Plate)

The conductive adhesive of the present disclosure can be used to attach a conductive (metal) reinforcing plate to a flexible printed wiring board.

Figure 6:
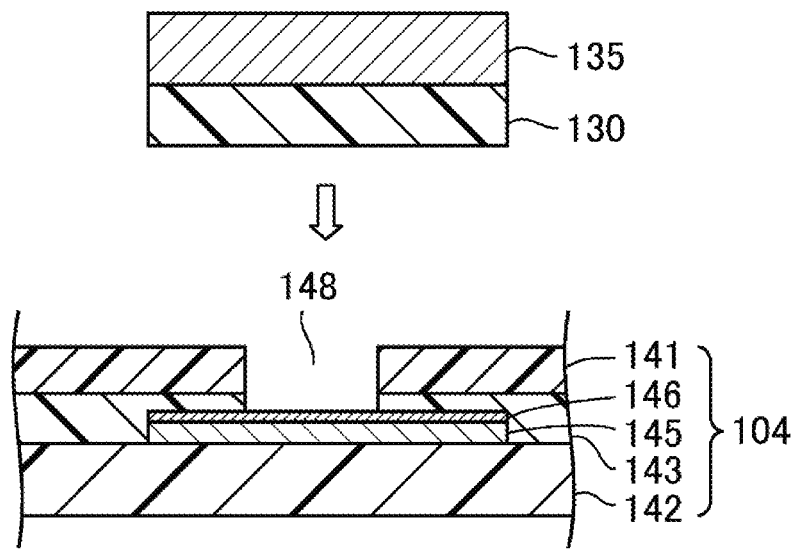
FIG. 6 is a cross-sectional view illustrating a process for bonding a conductive reinforcing plate.

If a conductive reinforcing plate is to be attached to a printed wiring board, a flexible printed wiring board 104 and a conductive reinforcing plate 135 having one surface provided with a conductive adhesive layer 130 made of a conductive adhesive of this embodiment are first prepared as shown in FIG. 6.

Figure 7:
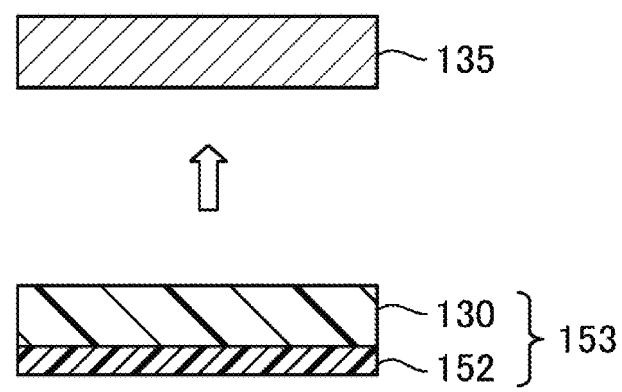
FIG. 7 is a cross-sectional view illustrating another process for bonding the conductive reinforcing plate.
Figure 8:
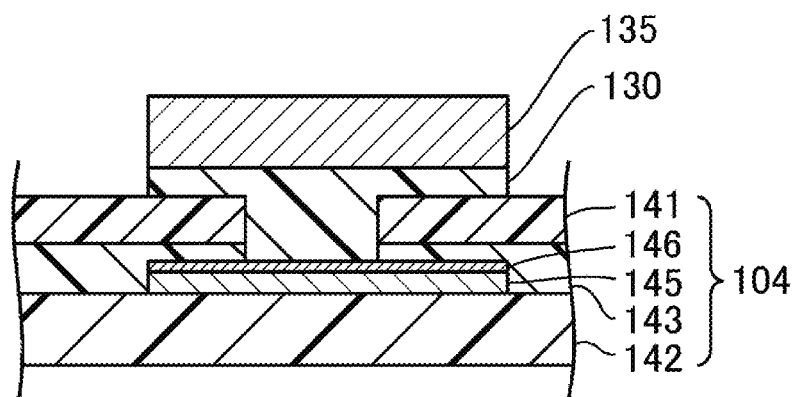
FIG. 8 is a cross-sectional view illustrating still another process for bonding the conductive reinforcing plate.

In a method for providing the conductive adhesive layer 130 on the surface of the conductive reinforcing plate 135, a release substrate (a separate film) 152 is first coated with a conductive adhesive to form a conductive adhesive film 153 including the conductive adhesive layer 130 as shown in FIG. 7, for example. Next, the conductive adhesive film 153 and the conductive reinforcing plate 135 are pressed against, and brought into close contact with, each other. As a result, the conductive reinforcing plate 135 including the conductive adhesive layer 130 as shown in FIG. 8 can be obtained. The release substrate 152 merely needs to be separated before use.

It is possible to use, as the release substrate 152, a base film, made of polyethylene terephthalate, polyethylene naphthalate, or other materials, to which a silicone or non-silicone release agent is applied onto a surface where the conductive adhesive layer 130 is formed. The thickness of the release substrate 152 is not specifically limited, and can be appropriately determined in view of ease of use.

The conductive adhesive layer 130 preferably has a thickness of 15 μm to 100 μm. Setting the thickness to be 15 μm or more allows the conductive adhesive layer 130 to have sufficient filling performance and to be adequately connected to a ground circuit. Further, setting the thickness to be 100 μm or less can satisfy the need to reduce the layer thickness, and helps reduce cost.

The flexible printed wiring board 104 includes, for example, a base member 142 and an insulating film 141 bonded to the base member 142 through an adhesive layer 143. The insulating film 141 has an opening 148 through which a ground circuit 145 is exposed. A surface layer 146 that is a gold plated layer is provided on an exposed portion of the ground circuit 145. Note that the flexible printed wiring board 104 may be replaced with a rigid substrate.

Next, the conductive reinforcing plate 135 is arranged on the printed wiring board 104 so that the conductive adhesive layer 130 is located over the opening 148. Then, the conductive reinforcing plate 135 and the printed wiring board 104 are vertically sandwiched between two hot plates (not shown) heated to a predetermined temperature (for example, 120° C.) so as to be pressed at a predetermined pressure (for example, 0.5 MPa) for a short time (for example, 5 seconds). As a result, the conductive reinforcing plate 135 is temporarily fastened to the printed wiring board 104.

Subsequently, the temperatures of two hot plates are set at a predetermined temperature (for example, 170° C.) higher than those during the temporary fixing process. A predetermined pressure (for example, 3 MPa) is applied to the conductive reinforcing plate 135 for a predetermined time (for example, 30 minutes) using these hot plates. Thus, the conductive reinforcing plate 135 can be fixed to the printed wiring board 104 with the opening 148 filled with the conductive adhesive layer 130.

Thereafter, a solder reflow process for component mounting is performed. In the reflow process, the flexible printed wiring board 104 is exposed to a high temperature of about 260° C. Non-limiting examples of components to be mounted include, in addition to a connector and an integrated circuit, a chip component such as a resistor and a capacitor. If the conductive reinforcing plate 135 is provided on one surface of the base member, an electronic component may be disposed on a surface of the base member 142 remote from the conductive reinforcing plate 135 to correspond to the conductive reinforcing plate 135. However, the conductive reinforcing plate 135 may be provided on both surfaces of the base member 142.

The conductive adhesive of this embodiment, which has high filling performance, sufficiently fills the opening 148 even if the diameter of the opening 148 is small, such as 1 mm or less. This can ensure good connection between the conductive reinforcing plate 135 and the ground circuit 145. If the conductive adhesive insufficiently fills the opening, fine bubbles enter the gap between a combination of the surface layer 146 and the insulating film 141 and the conductive adhesive layer 130. As a result, when the conductive adhesive layer 130 is exposed to high temperatures in the reflow process, the bubbles may grow, and the interconnect resistance of the conductive adhesive layer 130 may increase. This may cause the conductive adhesive layer 130 to be separated at worst. However, the conductive adhesive layer 130 of this embodiment has good adhesiveness with the surface layer 146 and the insulating film 141, and keeps having good adhesiveness even after the reflow process. Thus, low interconnect resistance can be maintained.

It is recommended that the interconnect resistance after the reflow process as an index of filling performance be as low as possible. However, the interconnect resistance to an opening with a diameter of 0.5 mm to be described in examples, for example, can be set to be preferably 300 mΩ/hole or less, more preferably 250 mΩ/hole or less, and still more preferably 200 mΩ/hole or less.

The conductive reinforcing plate 135 may be formed of an electrically conductive material having an appropriate strength. Examples of the electrically conductive material include nickel, copper, silver, tin, gold, palladium, aluminum, chromium, titanium, and zinc. In particular, stainless steel is recommended to increase the corrosion resistance and strength.

The thickness of the conductive reinforcing plate 135 is not specifically limited, but may be preferably 0.05 mm or more and more preferably 0.1 mm or more, and may be preferably 1.0 mm or less and more preferably 0.3 mm or less for the purpose of reinforcement.

In addition, a nickel layer is preferably formed on the surface of the conductive reinforcing plate 135. The nickel layer may be formed by any process, but may be formed by electroless plating, electrolytic plating, or any other process. The formation of the nickel layer can improve close contact between the conductive reinforcing plate and the conductive adhesive.

Also if the conductive adhesive of the present disclosure is used to bond a conductive reinforcing plate, the conductive adhesive preferably has the same loss modulus as that obtained if it is used to bond an electromagnetic-wave shielding film, in order to allow the conductive adhesive to have sufficient filling performance. To prevent the conductive reinforcing plate from being separated, the conductive adhesive preferably has the same peel strength as that obtained if it is used to bond the electromagnetic wave shielding film.

EXAMPLES

The conductive adhesive of the present disclosure will now be described in more detail with reference to examples. The following examples are illustrative, and are not intended to limit the present invention.

<Formation of Electromagnetic-Wave Shielding Film>

A release film was coated with an epoxy resin with a thickness of 6 μm and dried to form a protective layer. Next, predetermined materials were mixed and stirred using a planetary mixer/deaerator to form a conductive adhesive composition of each of first to third examples and first to third comparative examples having the composition shown in Table 1.

A value used as the median size of a filling-performance improver was measured with a diffraction particle size distribution analyzer (MICROTRAC S3500, manufactured by Microtrac Inc.) in a volume distribution mode, where pure water (refractive index=1.33) was used as a solvent, and the refractive index of inorganic particles was set to be 1.51.

Next, a paste-like conductive adhesive composition was applied onto the protective layer, and dried at 100° C. for three minutes to form an electromagnetic-wave shielding film. The thickness of the electromagnetic-wave shielding film was 17 μm before pressing and 10 μm after pressing. The thickness of the electromagnetic-wave shielding film was measured with a micrometer.

<Measurement of Loss Modulus>

The dynamic viscoelasticity of the conductive adhesive composition of each of the examples and comparative examples was measured with a rheometer (MCR302, manufactured by Anton Paar GmbH) in a range of 30° C. to 200° C., and the loss modulus (G") at 200° C. was determined. As a measurement sample, a conductive adhesive composition formed into a disc having a diameter of 25 mm and a thickness of 1 mm was used, and was measured under the following conditions.

Plate: D-PP25/AL/S07 Diameter 25 mm
Angular Deflection: 0.1%
Frequency: 1 Hz
Measurement Range: 30 to 200° C.
Temperature Rising Speed: 6° C./min <Adhesiveness to Polyimide>

A 180-degree peeling test was performed to measure the adhesiveness between polyimide and the conductive adhesive. Specifically, a surface of an electromagnetic-wave shielding film near a conductive adhesive layer was bonded to a polyimide film (Kapton 100EN (registered trademark) manufactured by DU PONT-TORAY CO., LTD.) under the conditions of a temperature of 170° C., a period of three minutes, and a pressure of 2 MPa. Next, a bonding film (manufactured by Arisawa Manufacturing Co., Ltd.) was bonded to a surface of the electromagnetic-wave shielding film near a protective layer under the conditions of a temperature of 120° C., a period of five seconds, and a pressure of 0.5 MPa. Next, a polyimide film (Kapton 100EN (registered trademark) manufactured by DU PONT-TORAY CO., LTD.) was bonded onto the bonding film to form a stack for evaluation. Then, the stack of the polyimide film, the bonding film, and the shielding film was peeled from the polyimide film at 50 mm/min. Table 1 shows average values, where the number n of tests is set to be five.

<Adhesiveness to Gold Plated Layer>

A 180-degree peeling test was performed to measure the adhesiveness between a gold plated layer formed on a surface of a copper foil of a copper-clad laminate and a conductive adhesive. Specifically, a surface of an electromagnetic-wave shielding film near a conductive adhesive layer is bonded to the gold plated layer formed on the surface of the copper foil of the copper-clad laminate film under the conditions of a temperature of 170° C., a period of three minutes, and a pressure of 2 MPa. Next, a bonding film (manufactured by Arisawa Manufacturing Co., Ltd.) was bonded to a surface of the electromagnetic-wave shielding film near a protective layer under the conditions of a temperature of 120° C., a period of five seconds, and a pressure of 0.5 MPa. Next, a polyimide film (Kapton 100H (registered trademark) manufactured by DU PONT-TORAY CO., LTD.) was bonded onto the bonding film to form a stack for evaluation. Then, the stack of the polyimide film, the bonding film, and the shielding film was peeled from the polyimide film at 50 mm/min Table 1 shows average values, where the number n of tests is set to be five.

<Formation of Shield Printed Wiring Board>

Next, the electromagnetic-wave shielding film formed in each of the examples and the comparative examples and the printed wiring board are bonded together using a press machine under the conditions of a temperature of 170° C., a period of three minutes, and a pressure of 2 to 3 MPa, thereby forming a shield printed wiring board.

The printed wiring board used herein included a base member 122 configured as a polyimide film, a copper foil pattern 125 simulating a ground circuit, an insulative adhesive layer 123, and a cover lay (insulating film) 121 configured as a polyimide film. As shown in FIG. 4, the copper foil pattern 125 was formed on the base member 122, and the insulative adhesive layer 123 and the cover lay 121 were formed on the copper foil pattern 125. A gold plated layer is provided, as a surface layer 126, on the surface of the copper foil pattern 125. The cover lay 121 had an opening 128 with a diameter of 0.5 mm to imitate a connecting portion with the ground.

<Measurement of Interconnect Resistance>

Figure 9:
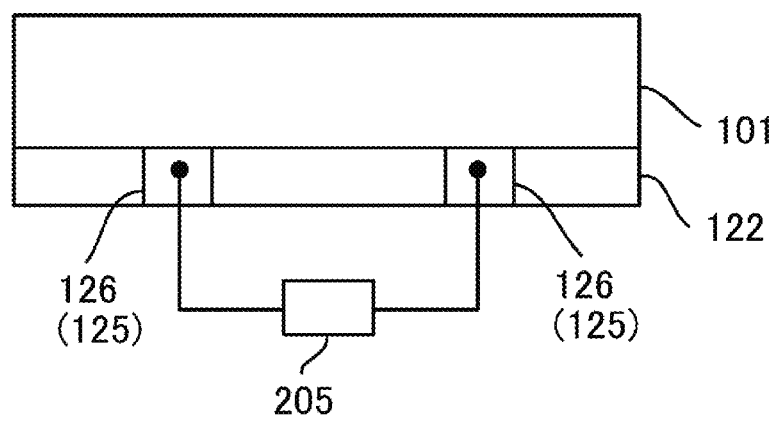
FIG. 9 illustrates a method for measuring interconnect resistance.

The connectivity between the copper foil pattern 125 and the electromagnetic-wave shielding film 101 of each of the shield printed wiring boards formed in the examples and the comparative examples was evaluated by measurement, using a resistance meter 205, of an electrical resistance between two rows of the copper foil pattern 125 having a surface provided with the surface layer 126 that is the gold plated layer, as illustrated in FIG. 9.

Next, the thus obtained shield printed wiring boards in the examples and the comparative examples were made to pass through a hot-air reflow apparatus five times. Thereafter, the interconnect resistance after the reflow process was measured by the technique described above. Bearing a reflow process using lead-free solders in mind, a temperature profile, as a condition for the reflow process, was set such that the polyimide film of the shield printed wiring board was exposed to a temperature of 265° C. for five seconds.

First Example

A solid epoxy resin having an epoxy equivalent of 700 g/eq and a number average molecular weight of 1,200 was used as the first resin component (A1). A polyurethane-modified polyester resin having an acid value of 20 mgKOH/g, a glass transition temperature of 40° C., and a number average molecular weight of 18,000 was used as the second resin component. The ratio (A1/(A1+A2)) of the mass of the first resin component (A1) to the total mass of the first resin component (A1) and the second resin component (A2) was set to be 5% by mass. Six parts by mass of 2-phenyl-1H-imidazole-4, 5-dimethanol (2PHZPW, manufactured by SHIKOKU CHEMICALS CORPORATION) was added, as the curing agent (A3), to 100 parts by mass of the first resin component (A1).

A dendritic silver-coated copper powder (D-1) having an average particle size of 13 μm and a silver coverage of 8% by mass was used as the conductive filler (B). The content of the conductive filler with respect to 100 parts by mass of the thermosetting resin (A) was set to be 55 parts by mass.

An aluminum salt of tris(diethylphosphinic acid) (OP 935, manufactured by Clariant (Japan) K.K.) was used as the filling-performance improver (C). The content of the aluminum salt with respect to 100 parts by mass of the thermosetting resin (A) was set to be 71 parts by mass.

The peel strength of the obtained conductive adhesive from polyimide was 5.3 N per 10 mm, and the peel strength of the conductive adhesive from the gold plated layer was 8.5 N per 10 mm. When the hole diameter was 0.5 mmφ, the initial interconnect resistance was 145 mΩ/hole, and the interconnect resistance after the reflow process was 190 mΩ/hole. The loss modulus at 200° C. was $1.3 \times 10^5$ Pa.

Second Example

A second example was similar to the first example except that 71 parts by mass of melamine cyanurate having an average particle size of 2 μm was used as the filling-performance improver (C).

The peel strength of the obtained conductive adhesive from polyimide was 4.1 N per 10 mm, and the peel strength of the conductive adhesive from the gold plated layer was 7.8 N per 10 mm. When the hole diameter was 0.5 mmφ, the initial interconnect resistance was 150 mΩ/hole, and the interconnect resistance after the reflow process was 220 mΩ/hole. The loss modulus at 200° C. was $1.9 \times 10^5$ Pa.

Third Example

A third example was similar to the first example except that 71 parts by mass of melamine polyphosphate having an average particle size of 6 μm was used as the filling-performance improver (C).

The peel strength of the obtained conductive adhesive from polyimide was 6.4 N per 10 mm, and the peel strength of the conductive adhesive from the gold plated layer was 9.0 N per 10 mm. If the hole diameter is 0.5 mmφ, the initial interconnect resistance was 150 mΩ/hole, and the interconnect resistance after the reflow process was 223 mΩ/hole. The loss modulus at 200° C. was $1.4 \times 10^5$ Pa.

First Comparative Example

A first comparative example is similar to the first example except that 35.5 parts by mass of an aluminum salt of tris(diethylphosphinic acid) (OP 935, manufactured by Clariant (Japan) K.K.) was used as the filling-performance improver (C).

The peel strength of the obtained conductive adhesive from polyimide was 7.3 N per 10 mm, and the peel strength of the conductive adhesive from the gold plated layer was 8.3 N per 10 mm. When the hole diameter was 0.5 mmφ, the initial interconnect resistance was 227 mΩ/hole, and the interconnect resistance after the reflow process was 457 mΩ/hole. The loss modulus at 200° C. was $4.7 \times 10^4$ Pa.

Second Comparative Example

A first comparative example is similar to the first example except that 142 parts by mass of an aluminum salt of tris(diethylphosphinic acid) (OP 935, manufactured by Clariant (Japan) K.K.) was used as the filling-performance improver (C).

The peel strength of the obtained conductive adhesive from polyimide was 3.3 N per 10 mm, and the peel strength of the conductive adhesive from the gold plated layer was 7.2 N per 10 mm. When the hole diameter was 0.5 mmφ, the initial interconnect resistance was over a measurement limit (OL), and the interconnect resistance after the reflow process was also OL. The loss modulus at 200° C. was $4.4 \times 10^5$ Pa.

Third Comparative Example

A third comparative example was similar to the first example except that the filling-performance improver (C) was not added to a conductive adhesive of the third comparative example.

The peel strength of the obtained conductive adhesive from polyimide was 6.7 N per 10 mm, and the peel strength of the conductive adhesive from the gold plated layer was 6.4 N per 10 mm. When the hole diameter was 0.5 mmφ, the initial interconnect resistance was 814 mΩ/hole, and the interconnect resistance after the reflow process was 1780 mΩ/hole. The loss modulus at 200° C. was $4.5 \times 10^4$ Pa.

Table 1 summarizes the composition and characteristics of the conductive adhesive of each of the examples and comparative examples.

TABLE 1

| | | | Ex. 1 | Ex. 2 | Ex. 3 | Com. Ex. 1 | Com. Ex. 2 | Com. Ex. 3 |
|---|---|---|---|---|---|---|---|---|
| Thermosetting Resin (A) | First Resin Component (A1) | Parts by Mass | 5 | ← | ← | ← | ← | ← |
| | Second Resin Component (A2) | Parts by Mass | 95 | ← | ← | ← | ← | ← |
| | A1/(A1 + A2) (mass %) | | 5 | ← | ← | ← | ← | ← |
| | Curing Agent (A3) | Parts by Mass | 6 | ← | ← | ← | ← | ← |
| Conductive Filler (B) | Shape | | Dendrite | ← | ← | ← | ← | ← |
| | Average Particle Size (μm) | | 13 | ← | ← | ← | ← | ← |
| | Parts by Mass | | 55 | ← | ← | ← | ← | ← |
| Gap-filling Improver (C) | Component | | Aluminum Salt of Tris (diethyl-phosphinic acid) | Melamine Cyanurate | Melamine Polyphosphate | Aluminum Salt of Tris (diethyl-phosphinic acid) | ← | — |
| | Parts by Mass | | 71 | ← | ← | 35.5 | 142 | — |
| Characteristics | Peel Strength (N/10 mm) | Polyimide | 5.3 | 4.1 | 6.4 | 7.3 | 3.3 | 6.7 |
| | | Gold Plated Layer | 8.5 | 7.8 | 9 | 8.3 | 7.2 | 6.4 |
| | Interconnect Resistance (mΩ/hole) | Initial | 145 | 150 | 150 | 227 | OL | 814 |
| | | After Reflow | 190 | 220 | 223 | 457 | OL | 1780 |
| | Loss Modulus (200° C.) | | $1.3 \times 10^5$ | $1.9 \times 10^5$ | $1.4 \times 10^5$ | $4.7 \times 10^4$ | $4.4 \times 10^5$ | $4.5 \times 10^4$ |
| | Loss Modulus (170° C.) | | $1.2 \times 10^5$ | $2.0 \times 10^5$ | $2.0 \times 10^5$ | $4.3 \times 10^4$ | $4.3 \times 10^5$ | $4.2 \times 10^4$ |
| | Loss Modulus (140° C.) | | $1.4 \times 10^5$ | $2.1 \times 10^5$ | $2.4 \times 10^5$ | $3.9 \times 10^4$ | $3.4 \times 10^5$ | $3.0 \times 10^4$ |
| | Storage Modulus (190° C.) | | $1.1 \times 10^5$ | $2.0 \times 10^5$ | $1.4 \times 10^5$ | $4.4 \times 10^4$ | $1.0 \times 10^6$ | $8.1 \times 10^4$ |
| | Storage Modulus (170° C.) | | $1.1 \times 10^5$ | $1.9 \times 10^5$ | $2.0 \times 10^5$ | $3.5 \times 10^4$ | $8.7 \times 10^5$ | $6.1 \times 10^4$ |
| | Storage Modulus (120° C.) | | $1.0 \times 10^5$ | $1.8 \times 10^5$ | $3.0 \times 10^5$ | $2.7 \times 10^4$ | $2.5 \times 10^5$ | $1.9 \times 10^4$ |
| | Storage Modulus (70° C.) | | $2.6 \times 10^5$ | $4.1 \times 10^5$ | $4.2 \times 10^5$ | $1.1 \times 10^5$ | $1.1 \times 10^5$ | $7.7 \times 10^4$ |

Figure 10:
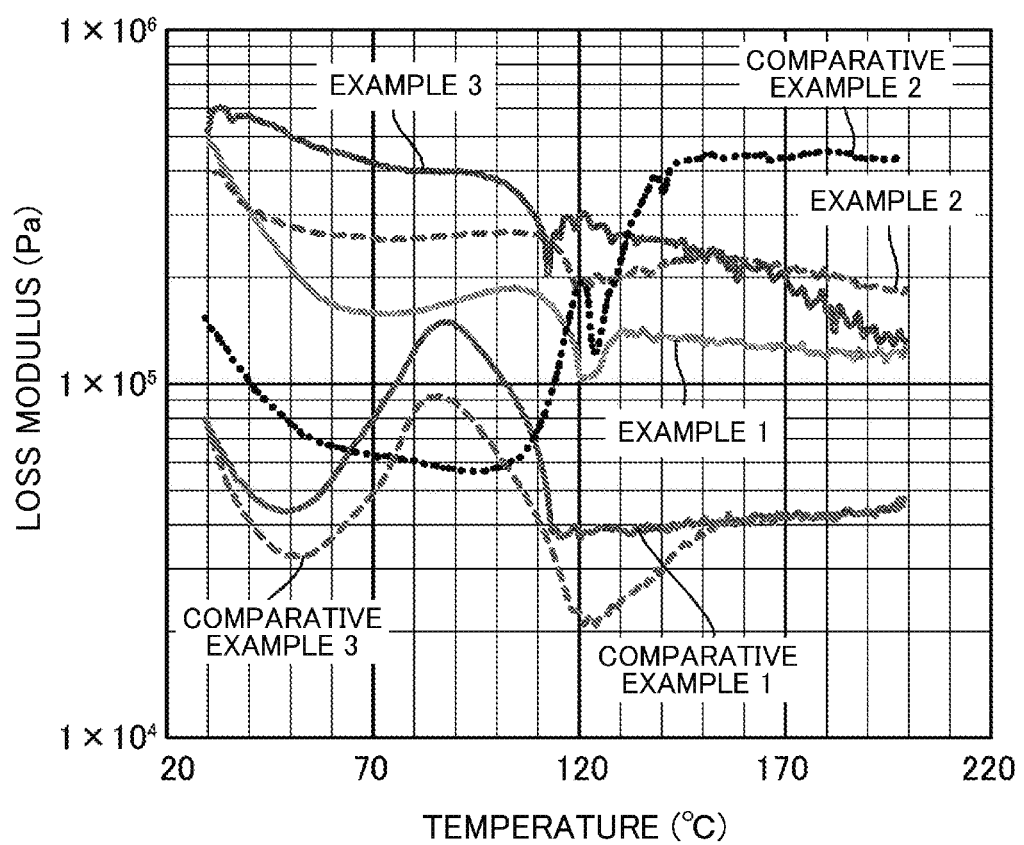
FIG. 10 is a graph showing the dependence of loss modulus on temperature.
Figure 11:
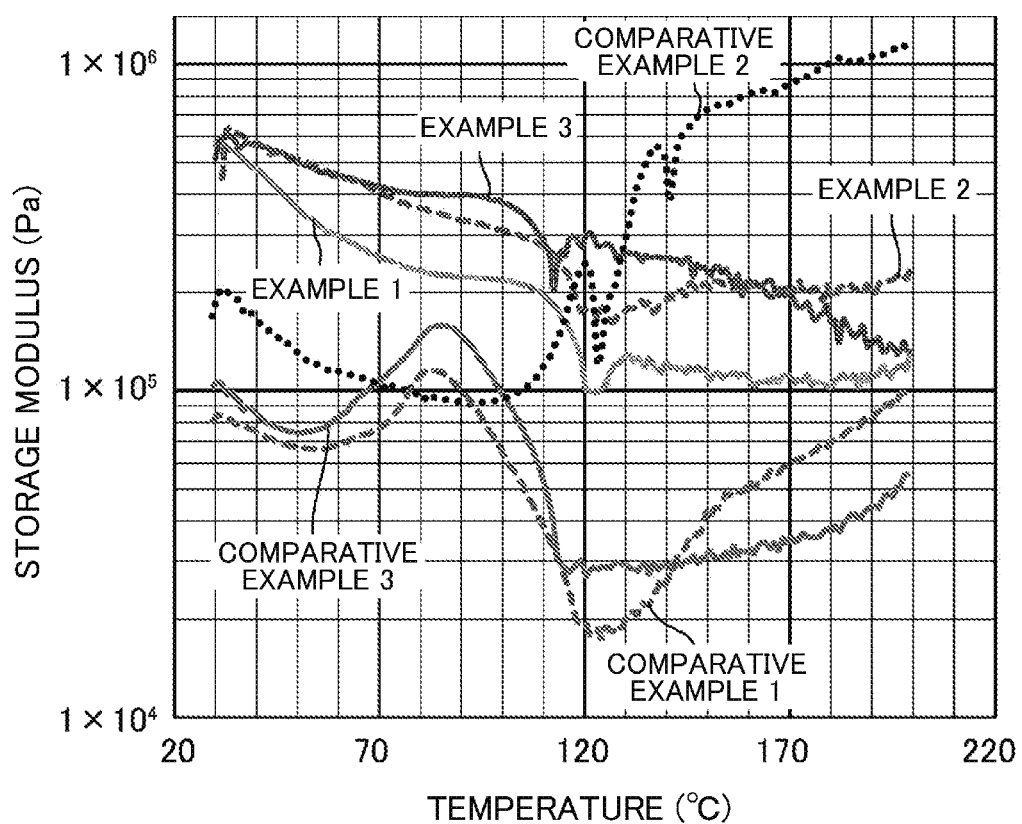
FIG. 11 is a graph showing the dependence of storage modulus on temperature.

FIG. 10 shows the dependence of the loss modulus of the conductive adhesive of each of the examples and comparative examples on temperature. The conductive adhesive of each of the first to third examples keeps having a more suitable loss modulus than the conductive adhesive of each of the first to third comparative examples, in a range of temperatures of 170° C. or higher, i.e., in the temperature range where the conductive adhesive is embedded. FIG. 11 shows the dependence of the storage modulus of the conductive adhesive of each of the examples and comparative examples on temperature. The storage modulus curve of the conductive adhesive of each of the first to third examples from 40° C. to 120° C. does not show a distinct maximum value greater than the storage modulus at 40° C.

INDUSTRIAL APPLICABILITY

The conductive adhesive of the present disclosure can have improved filling performance and improved adhesiveness, and is useful as a conductive adhesive for use in a flexible printed wiring board, for example.

DESCRIPTION OF REFERENCE CHARACTERS

101 Electromagnetic-Wave Shielding Film
102 Printed Wiring Board
104 Printed Wiring Board
111 Conductive Adhesive Layer
112 Protective Layer
113 Shielding Layer
121 Insulating Film
122 Base Member
123 Adhesive Layer
125 Ground Circuit
126 Surface Layer
128 Opening
130 Conductive Adhesive Layer
135 Conductive Reinforcing Plate
141 Insulating Film
142 Base Member
143 Adhesive Layer
145 Ground Circuit
146 Surface Layer
148 Opening
151 Support Substrate
152 Release Substrate
153 Conductive Adhesive Film
205 Resistance Meter

The invention claimed is:

1. A conductive adhesive, comprising:
a thermosetting resin (A);
a conductive filler (B); and
a filling-performance improver (C), wherein
the thermosetting resin (A) contains a first resin component (A1) having a first functional group, and a second resin component (A2) having a second functional group that reacts with the first functional group, and
the filling-performance improver (C) contains an organic salt, and
the conductive adhesive contains from 40 to 140 parts by mass of the filling-performance improver (C) relative to 100 parts by mass of the thermosetting resin (A).

2. The conductive adhesive of claim 1, wherein the filling-performance improver (C) is a metal salt of phosphinic acid.

3. The conductive adhesive of claim 2, wherein the metal salt of phosphinic acid has a median size of 5 µm or less.

4. The conductive adhesive of claim 1, wherein
the first functional group is an epoxy group, and
the second resin component (A2) has a glass transition temperature from 5° C. to 100° C., a number average molecular weight from 10,000 to 50,000, and a functional group that reacts with the epoxy group.

5. The conductive adhesive of claim 1, wherein the second resin component (A2) is an urethane-modified polyester resin.

6. An electromagnetic-wave shielding film, comprising:
a protective layer; and
a conductive adhesive layer, wherein the conductive adhesive layer contains the conductive adhesive of claim 1.

7. A printed wiring board reinforcing plate, comprising:
a conductive reinforcing plate; and
a conductive adhesive layer provided on at least one of surfaces of the conductive reinforcing plate, wherein the conductive adhesive layer contains the conductive adhesive of claim 1.

8. A shield printed wiring board, comprising:
a base member including a ground circuit;
a cover lay covering the ground circuit and having an opening through which a portion of the ground circuit is exposed; and
an electromagnetic-wave shielding film bonded to the cover lay, wherein the electromagnetic-wave shielding film includes a conductive adhesive layer containing the conductive adhesive of claim 1.

9. A printed wiring board, comprising:
a base member including a ground circuit provided on at least one of surfaces of the base member;
a cover lay covering the ground circuit and having an opening through which a portion of the ground circuit is exposed; and
a conductive reinforcing plate facing the ground circuit;
a conductive adhesive layer joining the ground circuit and the conductive reinforcing plate together such that the ground circuit and the conductive reinforcing plate are electrically continuous; and
an electronic component arranged on a portion of the base member corresponding to the conductive reinforcing plate,
wherein the conductive adhesive layer contains the conductive adhesive of claim 1.

* * * * *